(12) United States Patent
Wu et al.

(10) Patent No.: US 8,613,796 B1
(45) Date of Patent: Dec. 24, 2013

(54) PALLADIUM PRECURSOR COMPOSITION HAVING A FLUORINATED COMPONENT

(71) Applicant: Xerox Corporation, Norwalk, CT (US)

(72) Inventors: Yiliang Wu, Oakville, CA (US); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/621,591

(22) Filed: Sep. 17, 2012

(51) Int. Cl.
*C23C 18/08* (2006.01)
*H01B 1/02* (2006.01)
*B05D 5/12* (2006.01)
*B05D 3/02* (2006.01)

(52) U.S. Cl.
USPC ............ 106/1.15; 106/1.21; 106/287.18; 252/518.1; 252/519.21; 252/519.3; 427/125; 427/83.1; 427/383.3

(58) Field of Classification Search
USPC .......... 106/1.15, 1.21, 287.18; 252/518.1, 252/519.21, 519.3; 427/125, 383.1, 383.3
See application file for complete search history.

(56) References Cited

U.S. PATENT DOCUMENTS

| | | | | |
|---|---|---|---|---|
| 5,882,736 A | * | 3/1999 | Stein et al. | 427/96.6 |
| 5,894,038 A | * | 4/1999 | Sharma et al. | 427/554 |
| 2003/0148024 A1 | * | 8/2003 | Kodas et al. | 427/125 |
| 2005/0005820 A1 | * | 1/2005 | Etheridge | 106/287.3 |
| 2008/0083299 A1 | * | 4/2008 | Simone et al. | 75/345 |
| 2009/0148600 A1 | * | 6/2009 | Li et al. | 427/256 |
| 2010/0233361 A1 | * | 9/2010 | Hu et al. | 427/125 |
| 2011/0059233 A1 | * | 3/2011 | Liu et al. | 106/287.18 |
| 2011/0174524 A1 | * | 7/2011 | Sharma et al. | 174/254 |
| 2012/0308719 A1 | * | 12/2012 | Wu et al. | 427/125 |
| 2012/0309193 A1 | * | 12/2012 | Wu et al. | 106/287.18 |
| 2013/0200312 A1 | * | 8/2013 | Wu | 252/514 |
| 2013/0202795 A1 | * | 8/2013 | Wu | 106/1.21 |

OTHER PUBLICATIONS

U.S. Appl. No. 13/290,825, filed Nov. 8, 2011.
U.S. Appl. No. 13/364,961, filed Feb. 2, 2012.
U.S. Appl. No. 13/365,001, filed Feb. 2, 2012.

* cited by examiner

*Primary Examiner* — Helene Klemanski
(74) *Attorney, Agent, or Firm* — Oliff & Berridge, PLC

(57) ABSTRACT

A palladium precursor composition includes at least one palladium salt and at least one fluorinated component, wherein if the fluorinated component is not a fluorinated organoamine, the composition further includes an organoamine, and if the fluorinated component is a fluorinated organoamine, the composition may optionally further include one or more additional fluorinated components. Further disclosed is a substantially pinhole-free palladium layer formed from the precursor composition.

20 Claims, 2 Drawing Sheets

PALLADIUM PRECURSOR COMPOSITION HAVING A FLUORINATED COMPONENT

BACKGROUND

The present disclosure relates to compositions and processes for depositing and forming palladium layers on various substrates. The compositions may be flowable solutions or pastes, for example, and used to coat and/or print objects such as electronic devices or components thereof by solution deposition processes including spin coating, dip coating, screen printing, offset printing, gravure printing, flexographic printing, and inkjet printing.

Palladium (Pd) is a rare metal with many unique properties, resulting in its widespread use. For example, palladium is used in catalytic converters of automobiles to convert combustion byproducts into less harmful substances. Palladium is also used in many electronics devices, ceramic capacitors, fuel cells, and so on. Palladium layers/structures are conventionally formed in such devices by electroplating, sputtering or chemical vapor deposition (CVD).

There is an urgent need to form a palladium layer by way of a solution deposition process. For high speed deposition/coating processes, there is a wetting challenge to achieve a defect free palladium layer on certain substrates.

SUMMARY

Disclosed herein are solution processable palladium precursor compositions that can be used to form palladium layers and/or structures on a variety of substrates. These compositions are useful for coating and printing substrates, such as in a pattern with a palladium layer, and can be used for fabricating electronically conductive elements, pathways, and/or circuits of electronic devices. The resulting palladium layers and/or structures are substantially uniform, exhibit high conductivity, and good adhesion at low temperatures, and are substantially free of defects, for example, are substantially free of pinholes.

A palladium precursor composition is disclosed, the palladium precursor composition comprising starting ingredients comprising at least one palladium salt and at least one fluorinated component, wherein if the fluorinated component is not a fluorinated organoamine, the composition further includes an organoamine, and if the fluorinated component is a fluorinated organoamine, the composition may optionally further include one or more additional fluorinated components.

In addition, a palladium precursor composition comprising starting ingredients comprising at least one palladium salt, at least one non-fluorinated organoamine, and at least one fluorinated component is disclosed.

A method for forming a palladium layer on a substrate is also disclosed, the method comprising solution depositing a palladium precursor composition comprising starting ingredients comprising at least one palladium salt and at least one fluorinated component upon the substrate or upon a receiving layer upon the substrate, wherein if the fluorinated component is not a fluorinated organoamine, the composition further includes an organoamine, and if the fluorinated component is a fluorinated organoamine, the composition may optionally further include one or more additional fluorinated components; and heating the solution deposited palladium precursor composition to form the palladium layer.

EMBODIMENTS

Figure 1:
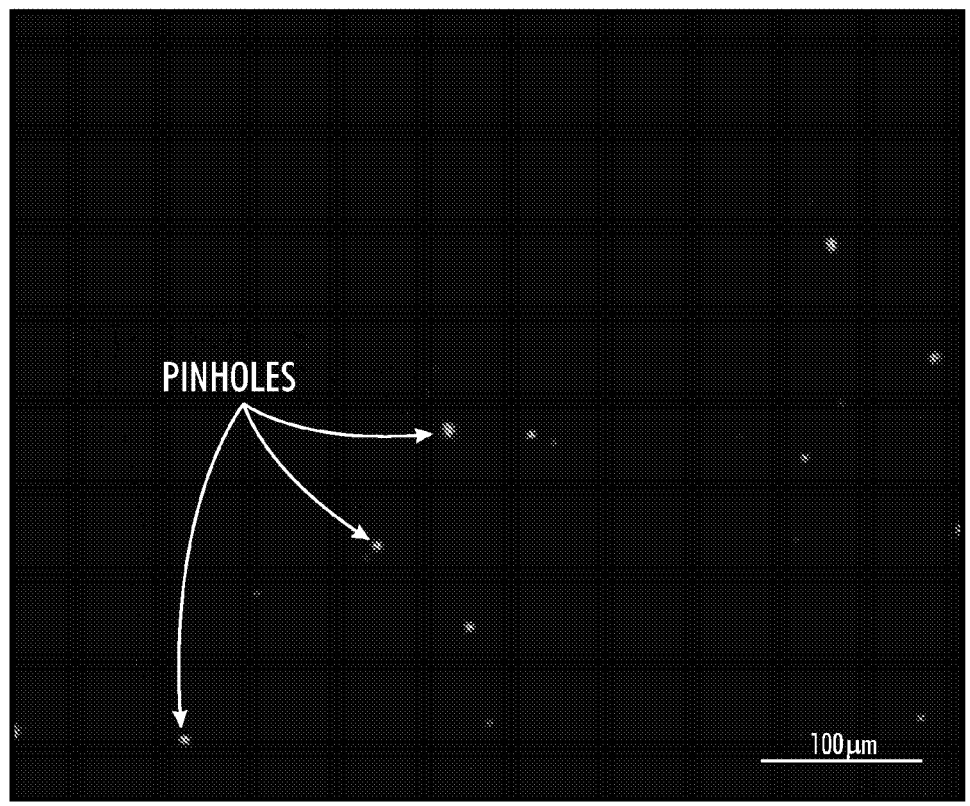
FIG. 1 is an image of a palladium layer formed from a precursor composition that does not include a fluorinated component.

The term "room temperature" refers to a temperature of about 20° C. to about 25° C.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The use of the singular terms "a", "an", and "the" should be construed to include plural referents as well, unless clearly indicated otherwise by the context. Put another way, these singular terms should be construed as "at least one."

The term "organo" as used herein refers, for example, to the presence of carbon atoms, although the organo group may include heteroatoms such as, for example, nitrogen, oxygen, sulfur, phosphorus, silicon, fluorine, chlorine, bromine, iodine and the like. Further, the organo group may be linear, cyclic, branched and the like.

The term "alkyl" as used herein refers, for example, to a radical composed entirely of carbon atoms and hydrogen atoms which is fully saturated and of the formula —$C_nH_{2n+1}$. The alkyl radical may be linear, branched, or cyclic, wherein n represents a number greater than or equal to 1.

The term "aryl" as used herein refers, for example, to an aromatic radical composed entirely of carbon atoms and hydrogen atoms. When aryl is described in connection with a numerical range of carbon atoms, it should not be construed as including substituted aromatic radicals. For example, an aryl containing from 6 to 10 carbon atoms should be construed as referring to a phenyl group (6 carbon atoms) or a naphthyl group (10 carbon atoms) only, and should not be construed as including a methylphenyl group (7 carbon atoms).

The term "substituted" as used herein refers, for example, to at least one hydrogen atom on the named radical being substituted with another functional group, such as halogen, hydroxyl, mercapto (—SH), —CN, —$NO_2$, —COOH, and —$SO_3H$. An example of a substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. For example, substituted aryl groups include methylphenyl and methoxyphenyl.

The term "alkenyl" as used herein refers, for example, to a radical composed entirely of carbon atoms and hydrogen atoms which contains at least one carbon-carbon double bond. An alkenyl radical may be linear or branched.

The term "alkynyl" as used herein refers, for example, to a radical composed entirely of carbon atoms and hydrogen atoms which contains at least one carbon-carbon triple bond. An alkynyl radical may be linear or branched.

The present disclosure relates to palladium precursor compositions which can be used with liquid-based deposition processes to make a palladium layer on an object or a substrate. The palladium precursor composition of the present disclosure comprises starting ingredients comprising at least a palladium salt, at least one organoamine, and at least one fluorinated component. In further embodiments, the precursor composition of the present disclosure comprises starting ingredients comprising at least a palladium salt, an organoamine which is not fluorinated, and a fluorinated component. In addition, the palladium precursor composition may further include a solvent which is not fluorinated. The palladium precursor composition may be substantially free of water. However, this does not require an absolute absence of water. Some residual water may be present in the precursor composition from the various ingredients or from ambient/atmospheric conditions.

The palladium salt may be any suitable salt. Suitable palladium salts are disclosed, for example, in U.S. patent application Ser. No. 13/290,825, filed on Nov. 8, 2011, and U.S. patent application Ser. Nos. 13/364,961 and 13/365,001, each filed on Feb. 2, 2012, which are totally incorporated herein by reference. For example, the palladium salt may be any palladium salt of the formula:

$$Pd(X)_2,$$

where X is any counter ion to palladium, and mixtures thereof. The palladium salt may be selected from, for example, a palladium carboxylate, for example, a palladium carboxylate of the formula $Pd(OOCR^1)_x(OOCR^2)_{2-x}$, wherein $R^1$ and $R^2$ are independently selected from hydrogen, alkyl having 1 to 11 carbon atoms, alkenyl having 2 to about 13 carbon atoms, and alkynyl having 2 to about 13 carbon atoms. Hydrogen atoms on $R^1$ or $R^2$ may be substituted with another functional group such as —CHO, —OH, halogen, and the like. "x" can be any number from 0 to 2, for example, 0, 0.01, 0.1, 1, 1.5, 1.57, 2.0, and the like. The palladium salt may be, for example, palladium acetate, palladium chloride, palladium nitrate, palladium sulfate, palladium iodide, palladium cyanide, ethylenediamine palladium chloride, tetraaminepalladium bromide, bis(acetylacetonato)palladium, diamine dinitro palladium, and mixtures thereof. For example, the salt may be selected from any compound in which the counter ion is $R'COO^-$, $Cl^-$, $Br^-$, $I^-$, $NO_3^-$, $SO_4^{2-}$, $HCO_3$ cyanide, acetylacetonato, nitro, or a mixture thereof, wherein R' is a hydrocarbon group comprising 1 to about 18 carbon atoms.

The palladium salt may compose from about 1 to about 50 weight percent (wt %) of the precursor composition, for example, the palladium salt makes up from about 5 wt % to about 30 wt % of the precursor composition.

The organoamine may be any suitable organoamine. The organoamine may be saturated or unsaturated. Unsaturated refers, for example to, a state in which not all of the available valence bonds along a hydrocarbon chain are satisfied, meaning that at least 2 carbon atoms are connected by at least one double bond. Thus, the phrase "unsaturated organoamine" refers to organoamines that include at least one carbon-carbon double bond that is not part of an aromatic ring. Saturated refers, for example, to a state in which all of the available valence bonds along a hydrocarbon chain are satisfied, meaning that at all of the carbon atoms along the alkyl are connected by single bonds.

Suitable saturated organoamines are disclosed, for example, in application Ser. No. 13/290,825, filed on Nov. 8, 2011, and suitable unsaturated organoamines may be any organoamine disclosed in U.S. patent application Ser. No. 13/364,961, filed on Feb. 2, 2012, which are totally incorporated herein by reference.

For example, the unsaturated organoamine may be any unsaturated organoamine that contains at least two carbons connected by at least one double bond. The unsaturated organoamine may be any unsaturated organoamine of the formula:

$$R^3\text{---}CH\text{===}CH\text{---}R^4\text{---}NH_2,$$

wherein $R^3$ represents a hydrogen or a hydrocarbon group having from about 1 carbon atom to about 25 carbon atoms, and $R^4$ represents a hydrocarbon group having from about 1 to about 25 carbon atoms, wherein the hydrocarbon group of $R^3$ and/or $R^4$ is independently selected from the group consisting of a substituted or unsubstituted alkyl, alkenyl, alkynyl, aryl and mixtures thereof. For example, the number of carbon atoms in the range may be from about 4 to about 20 carbon atoms, or from about 8 to about 18 carbon atoms. For example, $R^1$ may be hydrogen. In addition, $R^3$ and/or $R^4$ may be alkyl, an alkenyl, an alkynyl, and an aryl. Hydrogen atoms on $R^3$ or $R^4$ may be substituted with another functional group such as —CHO, —OH, halogen, and the like. For example, the unsaturated organoamine may be oleylamine, allylamine, geranylamine, N-methylallylamine, diallylamine, 2-(1-cyclohexenyl)ethylamine, 3-pyrroline, 1,2,3,6-tetrahydropyridine, N-methyl-2-methylallylamine, and the like, or mixtures thereof.

Generally, the saturated or unsaturated organoamine may be any primary, secondary, or tertiary amine. However, the organoamine may desirably be a primary amine. The unsaturated organoamine can also be a monoamine, diamine, or polyamine. Combinations of more than one unsaturated organoamine are also contemplated. More specifically, the unsaturated organoamine may contain one, two, or more amine groups of Formula (I):

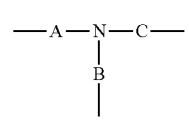

Formula (I)

wherein A, B, and C are independently selected from hydrogen and an organic group, wherein and at least one of A, B, or C is an organic group. When the tertiary amine contains more than one such amine group, the nitrogen atoms are not directly bonded to each other. An organic group contains at least one carbon atom. Example organic groups include alkyl, aryl, substituted alkyl, substituted aryl, alkenyl and alkynyl. Any two of organic groups A, B and C may form a cyclic structure.

The molar ratio of the organoamine to the palladium salt may be from about 1:1 to about 10:1. For example, the molar ratio of organoamine to palladium salt is from about 1:1 to about 5:1, or from about 2:1 to about 4:1, or from about 2:1 to about 3:1.

The organoamine(s) present in the precursor composition may be immiscible in water. Generally, water immiscible organoamines contain at least about 4 carbon atoms per amine group. For example, water immiscible organoamines include primary aliphatic amines of the formula $NH_2\text{---}R^3$, where $R^3$ is alkenyl having from about 4 to about 25 carbon atoms, or from about 8 to about 18, for example $R^3$ may be a linear alkenyl chain. Secondary aliphatic amines may also be water immiscible, such as those of the formula $NHR^4R^5$, where at least one of $R^4$ and $R^5$ is alkenyl having from about 4 to about 25 carbon atoms, or form about 8 to about 18 carbon atoms. Tertiary aliphatic amines may also water immiscible, such as those of the formula $NR^6R^7R^8$, where at least one of $R^6$, $R^7$, and $R^8$ are independently alkenyl having from about 4 to about 25 carbon atoms, or from about 8 to about 18 carbon atoms.

The organoamine may, for example, be ethylamine, propylamine, butylamine, pentylamine, hexylamine, heptylamine, octylamine, nonylamine, decylamine, undecylamine, dodecylamine, tridecylamine, tetradecylamine, hexadecylamine, diaminobutane, diaminopentane, diaminohexane, diaminoheptane, diaminooctane, diaminononane, diaminodecane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, triethylamine, tributylamine, or trihexylamine, and the like, water immiscible organoamines include octylamine, nonylamine, decylamine, undecylamine, dodecylamine, tridecylamine, tetradecylamine, hexadecylamine, dipentylamine, dihexylamine, diheptylamine, dioctylamine, dinonylamine, didecylamine, propylpentylamine, butylpentylamine, tributylamine, trihexylamine, and the like, or combinations thereof.

The organoamine is intended to function as a reducing agent for the palladium precursor. Therefore, the precursor composition may, for example, not contain any additional reducing agents, or may be substantially free of additional reducing agents, other than the organoamine, and additional reducing agents need not be separately added as an additional processing step. Examples of reducing agents that may, for example, be excluded from the precursor composition are formic acid and formic acid salts or esters, hypophosphites, hydrazines, ammonium compounds, amine borane compounds, alkali metal borohydrides, oxalic acid, alkali or alkaline earth sulfites, and the like.

The organoamine may function as a solvent, with the palladium salt being dissolved in the organoamine. The organoamine should thus be in the liquid phase. The molar ratio of the organoamine to the palladium salt may be at least about 2:1 to ensure dissolution of the palladium salt in the organoamine.

However, if the organoamine is being used as a solvent, it does not mean the organoamine must have a melting point less than about room temperature. In order for the organoamine to be in the liquid phase, the temperature of the precursor composition may be greater than room temperature. For example, the organoamine may have a melting point less than about 50° C., or a melting point of less than about 40° C., including a melting point less than room temperature. The liquid phase/low melting point is advantageous in achieving a uniform palladium layer. For example, an organoamine with a high melting point may crystallize out after deposition, which may cause high surface roughness, holes and/or pinholes in the final palladium layer.

In converting the precursor composition into palladium, the temperature of the precursor composition may be warmed from room temperature up to about 150° C. to about 350° C., including from about 150° C. to about 250° C. At least a portion of this temperature may occur with no external heat source, for example due to an exothermal reaction between the palladium salt and the unsaturated organoamine.

The organoamine is not required to be the sole solvent of the precursor composition. The precursor composition may also comprise a second solvent to dissolve the palladium salt and/or the organoamine, for example, when the palladium salt does not completely dissolve in the organoamine solvent. Another organic solvent, which may be immiscible with water, may be included. Water immiscible means, for example, when a given organic solvent is mixed with water at about equal amounts by volume, if a phase separation is detected (either visually or by instruments such as light scattering or refractive index) after settling, the solvent is considered to be water immiscible. For example, at least about 0.5 wt % of the amount of the given component added to the second solvent should dissolve, including at least about 1 wt %, or at least about 10 wt % of the amount added. The non-soluble portion, meaning the portion of the given component that did not dissolve, may be removed from the precursor composition by, for example, filtration.

Any suitable water immiscible organic solvent may be used for the second solvent. The second organic solvent may be, for example, a hydrocarbon solvent, for example a substituted hydrocarbon, an aromatic hydrocarbon, a ketone, ester, ether, and the like. The hydrocarbon solvent may, for example have at least 6 carbon atoms, from 6 to about 25 carbon atoms. For example, the solvent may be include toluene, xylene, mesitylene, ethylbenzene, diethylbenzene, trimethyl benzene, methyl ethylbenzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, acetophenone, decalin, heptane, hexane, benzene, cyclohexane, pentane, octane, and the like, or mixtures thereof. The second organic solvent may have a boiling point of at least about 80° C., at least about 100° C., or at least about 150° C.

Water and/or a water miscible solvent may be present in the precursor composition. Any suitable concentration of the water and/or water miscible solvent(s) may be present. For example, the amount of water and/or water miscible solvent (by weight) may be less than the amount of organoamine. Examples of water miscible solvents include alcohols such as methanol, ethanol, propanol, and butanol; glycols; acetone; tetrahydrofuran (THF); dichloromethane; ethyl acetate; dimethylformamide (DMF); dimethyl sulfoxide (DMSO); acetic acid; acetonitrile; and dioxane.

Any of the above described solvents may be present in any suitable amount necessary to dissolve the materials of the precursor composition. For example, the solvent may comprise from about 1 to about 75 wt % of the precursor composition, such as from about 5 to about 50 wt % of the precursor composition, or from about 10 to about 25 wt % of the precursor composition.

The organoamine may also function as a complexing agent. A complexing agent refers, for example, to a compound that is attached to the central atom of a coordination compound. A coordination compound refers, for example, to a compound formed from the union of a metal ion with a nonmetallic complexing agent. Thus, the palladium and organoamine in the precursor composition form a complex.

It should be noted that palladium is sometimes used as a catalyst in organic synthesis. When an organic synthesis reaction contains an organoamine reagent, a palladium organoamine complex might be formed in an organic reaction. This differs from the present disclosure in several aspects. First, the palladium in a synthesis reaction functions as a catalyst, while the palladium in the present precursor composition provides a metal source for a palladium layer and does not act as a catalyst. Second, the organoamine in a synthesis reaction functions as a reactant, while the organoamine in the precursor composition functions as a complexing agent and/or solvent. Third, palladium is used in a catalytic amount in those synthesis reactions, while palladium salt is merely one of the dominant components of the precursor composition. In general, here the precursor composition is a non-catalytic composition. Stated differently, the palladium amine complex is not used in forming a product from two reactants. The term "non-catalytic" refers to the fact that the palladium in the palladium precursor composition does not function as a catalyst. This can be seen in that the organoamine does not become part of a third compound in the precursor composition. In other words, the palladium precursor composition does not contain any compounds which become covalently coupled to the organoamine.

The precursor composition also contains a fluorinated component. Fluorinated refers, for example to, any material made or modified to include at least one fluorine atom in the molecular structure. The fluorinated component may be, for example, a fluorinated organoamine, a fluorinated solvent, a fluorinated carboxylic acid, or combinations thereof. The fluorinated component may be in addition to the materials described above, or may substitute for one of the materials described above. For example, if a fluorinated organoamine is the fluorinated component, it is not necessary to include an additional non-fluorinated organoamine in the precursor composition. Likewise, if a fluorinated solvent is included in the precursor composition, it is not necessary to also include an additional non-fluorinated solvent. However, a non-fluorinated organoamine and/or a non-fluorinated solvent may be included in a precursor composition that contains a fluorinated organoamine and/or a fluorinated solvent.

Any suitable fluorinated organoamine may be used as the fluorinated component. For example, the fluorinated organoamine may be a fluorinated form of any of the organoamines described above. For example, the fluorinated organoamine may be 1-H,1H,2-H,2-H perfluorodecylamine, methyl(3,3,3-trifluoropropyl)amine, 3-(perfluorooctyl)propylamine 1-H,1-H perfluorooctylamine, 1H,1H-perfluorohexylamine, 3-(perfluorooctyl)propylamine, and the like, or combinations thereof.

Any suitable fluorinated carboxylic acid may be used as the fluorinated component. For example, the fluorinated carboxylic acid may be perfluoro octanoic acid and the like. Any suitable fluorinated solvent may be used as the fluorinated component. For example, the fluorinated solvent may be a fluorinated form of any the solvents described above, such as a fluorinated ether, which includes the Asahi Glass ASAHIKLIN series, 3M NOVEC series, DuPont VERTREL series, and the like, a fluorinated hydrocarbon such as 1-H,1H,2-H perfluoro-1-decene, perfluoro decalin, 2,3-dihydroperfluoropentane, 4-fluorotoluene, alpha, alpha, alpha-trifluorotoluene, fluoro-xylene, and the like, and combinations thereof. Exemplary fluorinated ethers include fluorinated ethers of the following formulas:

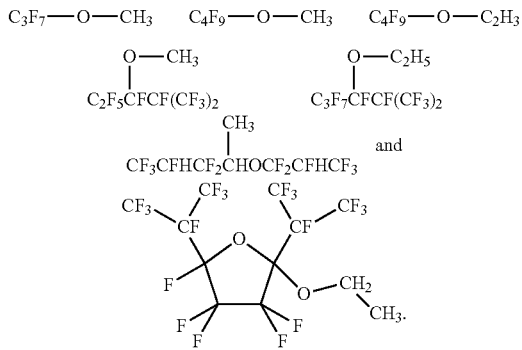

The precursor composition has a low surface tension of less than about 25 mN/m at 25° C. For example, the surface tension at 25° C. may be about 20 to about 25 mN/m, such as from about 21 to about 24.9 mN/m, or from about 22 to about 24.8 mN/m. In addition, when deposited on a substrate, the precursor composition may have a contact angle no larger than 30°. For example, the contact angle may be from about 1° to about 30°, such as from about 5° to about 25°, or from about 10° to about 20°.

The precursor composition may be formed into a layer by depositing the precursor composition on a substrate. The substrate may be, for example, a metal substrate, for example, copper, silver, aluminum, nickel and the like, a plastic substrate, for example, polyester, polyimide, polyketone, polysulfone, epoxy, phenolic resin and the like, and other substrates, for example, glass, silicon wafer, paper, and ceramic, and the like, or mixtures thereof.

In depositing the precursor composition, a receiving layer can be applied prior to depositing the precursor composition on the substrate. The receiving layer may enhance the adhesion of the precursor composition. Any suitable receiving layer can be used, for example, a receiving layer formed from a silane, or a silane comprising an amino group.

The depositing of the precursor composition may be performed, for example, by solution depositing. Solution depositing, for example, refers to a process where a liquid is deposited upon the substrate to form a coating or layer. This is in contrast to vacuum depositing processes. The present processes for forming a palladium layer are also different from other solution-based processes, for example electroplating, which requires a plate to remain immersed in a solution and also requires exposure to an electric current to form a metal coating on the plate. The process also offers several advantages compared to other processes such as the decreasing the amount of waste and decreasing the amount of time necessary to coat a substrate. Solution depositing includes, for example, spin coating, dip coating, spray coating, slot die coating, flexographic printing, offset printing, or inkjet printing the palladium second composition onto the substrate.

The precursor composition may be spin coated, for example for about 10 to about 1,000 seconds, for about 50 seconds to about 500 seconds, or from about 100 seconds to about 150 seconds, onto a substrate at a speed of, for example, from about 100 revolutions per minute (rpm) to about 5,000 rpm, from about 300 rpm to about 3,000 rpm, or from about 500 rpm to about 1,500 rpm.

The coating process may also be a high speed coating process. For example, the coating web will run at a speed of about 1 meter per second to about 500 meters per second, including from about 1 meter per second to about 200 meters per second.

The substrate coated with the precursor composition is then heated to form a palladium layer on the substrate. The heating causes the palladium amine complex or palladium salt to thermally decompose to form a solid palladium layer.

During the heating, a portion of the palladium organoamine complex may first form palladium nanoparticles in-situ. These palladium nanoparticles subsequently coalesce into a continuous and uniform palladium layer. This intermediate step where palladium nanoparticles are formed will enhance uniformity of the final palladium film. This is different from a conventional electroless plating process, where the palladium salt deposits into a palladium layer directly without going through an intermediate nanoparticle form. The formation of palladium nanoparticles is evidenced by the color change of the deposited palladium organoamine complex upon heating. A black color is often observed prior to the formation of the silvery metallic palladium layer, indicating that a palladium nanoparticle intermediate was formed during the heating step.

In addition, when the palladium precursor composition is heated to form the palladium layer, the temperature of the precursor composition is increased above the temperature of the precursor composition during the solution deposition. As previously discussed, the temperature of the precursor composition may be greater than room temperature to ensure the organoamine is in the liquid phase during the solution deposition.

The heating may be performed at any temperature that does not cause adverse changes in the properties of the previously deposited layer(s) or the substrate (whether a single layer substrate or multilayer substrate), for example, from about 60° C. to about 350° C., from about 100° C. to about 300° C., or from about 150° C. to about 250° C. The heating may be performed for a period of up to 30 minutes, and could be for a period as short as 0.1 seconds depending on the size of the palladium layer and the heating method. For example, the period of heating may be from about 0.1 second to about 30 minutes, from about 1 second to about 20 minutes, or from about 1 minute to about 10 minutes.

The heating may be performed in air, in an inert atmosphere (for example, under nitrogen or argon), or in a reducing atmosphere (for example, under nitrogen containing from 1 to about 20 percent by volume hydrogen). The heating can also be performed under normal atmospheric pressure or at a reduced pressure of, for example, from about 1,000 millibars to about 0.01 millibars. Examples of heating techniques may include thermal heating (for example, a hot plate, an oven, and a burner), infra-red ("IR") radiation, a laser beam, flashlight, microwave radiation, or UV radiation, or a combination thereof. This heating process is different from a conventional electroless plating process, where the palladium salt deposits into a palladium layer directly without going through a second nanoparticle form. The palladium layer produced by the heating is suitable for use, for example, in catalytic converters and as an electrically conductive element in electronic devices, such as ceramic capacitors, fuel cells, and the like.

The deposition processes described above may also be repeated to build up a thicker palladium layer on the object. For example, the thickness of the final layer may also be from about 10 nanometers to about 50 micrometers, or from about 50 nanometers to about 30 micrometers, or from about 50 nm to about 5 micrometers, or from about 80 nm to about 1 micrometer. In this regard, multiple solution deposition steps may be performed, with one subsequent heating to form the final layer. Alternatively, the steps of solution deposition followed by heating can be repeated multiple times to build a thick layer out of several thinner layers.

The palladium layer deposited on the substrate may be electrically conductive, and may, for example, be deposited in a predetermined pattern, such as an electrically conductive pathway or circuit on a substrate. The palladium layers produced according to the present disclosure have high conductivity and good adhesion at low temperatures. For example, the conductivity of the palladium layer produced by heating is, for example, from about 100 Siemens/centimeter ("S/cm") to about 50,000 S/cm, from about 1,000 S/cm to about 10,000 S/cm, such as from about 2,000 S/cm, to about 5,000 S/cm, or for example, the conductivity may be at least 1,000 S/cm. Conductivity was measured using the 4-probe method at room temperature.

The palladium layer also does not need to be electrically conductive. Although heating causes the decomposition of the second composition into palladium film or layer, due to the presence of other ions, for example, from the salt, a residual amount of the unsaturated organoamine and its decomposed form, and/or due to the presence of insulative additives in the first composition such as polymers, the palladium layer may not be conductive.

If desired, additional layers can be applied on top of the palladium layer (the additional layers may be referred to, for example, as overcoat layers). Any layer known in the art may be applied, for example, materials with resistance to scratching. Materials that may be used to form an overcoat layer include, for example, an epoxy resin, a polyurethane, a phenol resin, a melamine resin, a polysiloxane, a poly(silsesquioxane), and the like. Polysiloxane and poly(silsesquioxane) (for example sol-gel approach) can be used to from a highly crosslinked polysiloxane or poly(silsesquioxane) overcoat layer. The overcoat layer may be a crosslinked polysiloxane, a crosslinked poly(silsesquioxane), or a crosslinked layer comprising poly(vinylphenol) and a melamine-formaldehyde resin. The thickness of the overcoat layer may be for example from about 10 nm to about 10 micrometers, including from about 10 nm to about 5 micrometers, or from about 50 nm to about 1 micrometer. The overcoat layer may be colorless to ensure the visibility of the palladium layer.

The palladium layer produced by the present disclosure is defect free, or at least substantially defect free. Defect refers, for example to, the presence of pinholes in the palladium layer. The presence of pinholes may be determined, for example, by using optical microscopy in transmission mode. Thus, substantially defect free refers, for example, to a palladium layer that is essentially free from pinholes. For example, a palladium layer produced from the precursor composition may have a pinhole density of less than about 10 pinholes/mm$^2$, less than about 5 pinholes/mm$^2$, or less than about 2 pinholes/mm$^2$. In addition to the reduction in the pinhole density, the size of the pinholes, if any, may also be reduced. The diameter of pinholes is, for example, less than 5 micrometers, less than 2 micrometers, or less than 1 micrometers, including less than 0.5 micrometers.

As discussed above, a palladium layer prepared by the present disclosure is very smooth and without defects. On the other hand, a palladium layer produced by a precursor composition containing a palladium salt and organoamine without a fluorinated component palladium may result in a layer that is not defect fee or is not substantially defect free.

EXAMPLES

Comparative Example 1

Comparative Example 1 is a palladium precursor composition produced according to the present disclosure, except that the comparative palladium precursor composition does not contain a fluorinated component. Palladium acetate (trimer) was purchased from Alfa Aesar. 2.5 g palladium acetate was added slowly into a mixture of 1.5 g toluene and 6.0 g octylamine at room temperature under stirring. The reaction is exothermal, so that temperature of the reaction mixed increased to about 60-70° C. After adding all palladium acetate, the reaction mixture was stirred at 60° C. for 6 more hours to form a light yellow solution. Surface tension of the solution was measured using a Kruss Processor Tensiometer K 100. The surface tension was 29.4 mN/m at 25° C. A small drop of the solution was placed on a clean glass slide. An advancing contact angle was visually estimated to be around 60°.

To mimic a high speed coating process, a glass slide was first spun at high speed, for example, 3000 rpm, a few drops of the coating solution was dispensed on the glass slide. After spinning for about 20 seconds, the resulting wet film was annealed at 200-250° C. for about three minutes. The film changed into a black color first, then changed to a shiny metallic color. However, as shown in FIG. 1, large pin holes could be detected in the palladium film using optical microscopy in transmission mode, and the number of pinholes is more than 10 pinholes/mm$^2$, which is attributed to the high surface tension of the coating solution that causes some wetting problems on the substrate. In FIG. 1, about 13 pinholes were counted.

Example 1

Figure 2:
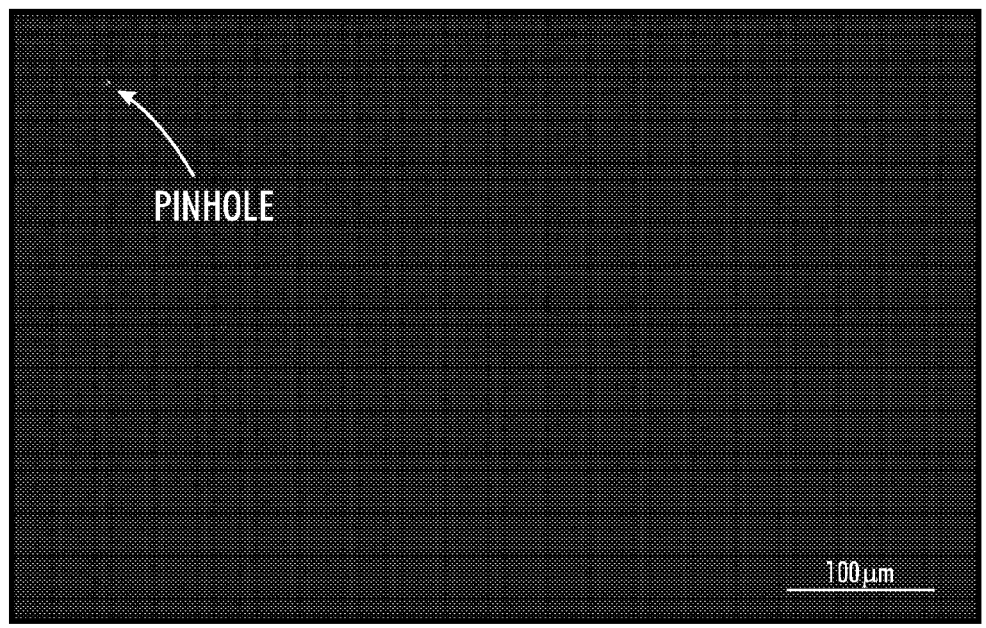
FIG. 2 is an image of a palladium layer formed from a precursor composition that includes a fluorinated component.

2.5 g of palladium acetate was added slowly into a mixture of 1.0 g of 1H,1H-perfluorooctylamine and 6.0 g octylamine at room temperature under stirring. After adding all palladium acetate, the reaction mixture was stirred at 60° C. for 8 or more hours to form a light yellow solution. The surface tension of the solution was measured, as described above, to be 24.7 mN/m at 25° C. The advancing contact angle of the solution on clean glass was visually estimated to be less than 30° by placing a small drop of the palladium composition on a cleaned glass substrate. Similar to Comparative Example 1, the solution was spin coated onto glass slide to form a uniform amorphous film. After annealing at 200-250° C. for about three minutes, the film changed into a black color first then shiny metallic color. As shown in FIG. 2, a dramatically reduced number and size of pinholes were observed in the palladium film using optical microscopy in transmission mode. In FIG. 2, only one small pinhole was observed.

Example 2

2.5 g palladium acetate was added slowly into 6.0 g octylamine at room temperature under stirring. After adding all palladium acetate, the reaction mixture was stirred at 60° C. for 6 more hours to form a light yellow solution. Thereafter, 1.5 g NOVEC 7600 fluorinated solvent (15 wt % of the total solution) was added into the mixture to form the palladium precursor composition. The surface tension of the solution was measured, as described above, to be 25.2 mN/m at 25° C. The advancing contact angle of the solution on clean glass was visually estimated to be less than 30°. The solution was spin coated onto a clean glass slide to form a uniform amorphous film. After annealing at 200-250° C. for about 3 minutes, the film changed into a black color first then shiny metallic color. Similar to Example 1, the number of pinholes and the size of the pinholes were reduced dramatically, when compared with Comparative Example 1. In fact, only 2 pinholes/mm$^2$ were detected.

Example 3

The palladium precursor composition was prepared in the same way as Example 2, except that 3.0 g NOVEC 7600 (~26 wt % of the solution) was added to form the palladium precursor composition. Surface tension of the composition was measured, as described above, to be 24.1 mN/m at 25° C. The advancing contact angle of the solution on clean glass was visually estimated to be less than 15°. The solution was spin coated onto a clean glass slide to form a uniform amorphous film. After annealing at 200-250° C. for about three minutes, the film changed into a black color first then shiny metallic color. Similar to Example 1, the number of pinholes and the size of the pinholes were reduced dramatically, when compared to Comparative Example 1. In fact, only 0.1 pinholes/mm$^2$ were observed.

Example 4

2.2 g of NOVEC 7600 was added to 7.5 g palladium precursor composition of Example 1 comprising both octylamine and 1-H,1-H perfluorooctylamine. The solvent content is about 23 wt %. Surface tension of the solution was measured, as described previously, to be 22.5 mN/m at 25° C. The advancing contact angle of the solution on clean glass was visually estimated to be less than 15°. The solution was spin coated onto a clean glass slide to form a uniform amorphous film. After annealing, the number of pinholes and the size of the pinholes were reduced dramatically, when compared with Comparative Example 1. In fact, 0 pinholes/mm$^2$ were observed.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A palladium precursor composition comprising:
starting ingredients comprising at least one palladium salt and at least one fluorinated component, wherein
if the fluorinated component is not a fluorinated organoamine, the composition further includes an organoamine, and
if the fluorinated component is a fluorinated organoamine, the composition may optionally further include one or more additional fluorinated components.

2. The composition of claim 1, wherein the at least one fluorinated component is selected from the group consisting of at least one fluorinated organoamine, at least one fluorinated solvent, at least one fluorinated carboxylic acid, and combinations thereof.

3. The composition of claim 2, wherein the fluorinated component is a fluorinated organoamine that is selected from the group consisting of 1H,1H, 2H,2H-perfluorodecylamine, 1H,1H-perfluorooctylamine, 1H,1H-perfluorohexylamine, methyl(3,3,3-trifluoropropyl)amine, 3-(perfluorooctyl)propylamine, and combinations thereof.

4. The composition of claim 2, wherein the fluorinated component is a fluorinated solvent that is at least one fluorinated ether and/or at least one fluorinated hydrocarbon.

5. The composition of claim 4, wherein the fluorinated solvent is at least one fluorinated ether that is selected from the group consisting of

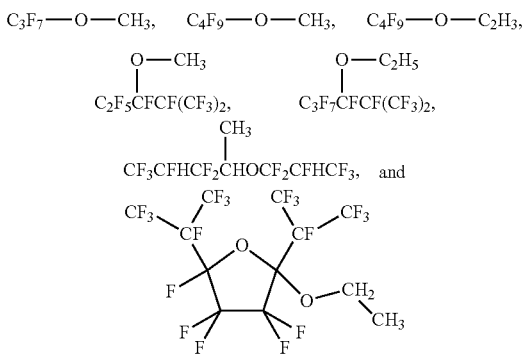

and combinations thereof.

6. The composition of claim 4, wherein the fluorinated solvent is at least one fluorinated hydrocarbon that is selected from the group consisting of 1H,1H,2H-perfluoro-1-decene, 2,3-dihydroperfluoropentane, 4-fluorotoluene, α,α,α-trifluorotoluene, fluoro-xylene, perfluoro decalin, and combinations thereof.

7. The composition of claim 1, wherein the composition is substantially free of water.

8. The composition of claim 1, wherein the composition further comprises at least one non-fluorinated solvent.

9. The composition of claim 1, wherein the composition has a surface tension of less than about 25.5 mN/m at 25° C.

10. A palladium precursor composition comprising:
at least one palladium salt, at least one non-fluorinated organoamine, and at least one fluorinated component.

11. The composition of claim 10, wherein the at least one fluorinated component is selected from the group consisting of at least one fluorinated organoamine, at least one fluorinated solvent, at least one fluorinated carboxylic acid, and combinations thereof.

12. The composition of claim 10, wherein the at least one fluorinated component is a fluorinated solvent that is at least one fluorinated ether and/or at least one fluorinated hydrocarbon.

13. The composition of claim 10, wherein the composition is substantially free of water.

14. A method for forming a palladium layer on a substrate comprising:
solution depositing a palladium precursor composition comprising starting ingredients comprising at least one palladium salt and at least one fluorinated component upon the substrate or upon a receiving layer upon the substrate, wherein
if the fluorinated component is not a fluorinated organoamine, the composition further includes an organoamine, and
if the fluorinated component is a fluorinated organoamine, the composition may optionally further include one or more additional fluorinated components; and
heating the solution deposited palladium precursor composition to form the palladium layer.

15. The method of claim 14, wherein the solution depositing is performed by spin coating, dip coating, spray coating, flexographic printing, offset printing, or inkjet printing.

16. The method of claim 14, wherein the palladium precursor composition has an advanced contact angle of less than 30° on the substrate or on the receiving layer upon the substrate.

17. The method of claim 14, wherein the heating is at a temperature ranging from about 60° C. to about 350° C.

18. The method of claim 14, wherein the heating occurs from about 0.1 seconds to about 30 minutes.

19. The method of claim 14, wherein the palladium layer is substantially free of pinholes.

20. The method of claim 14, wherein the palladium layer has a pinhole density of less than 10 pinholes/mm$^2$.

* * * * *